(12) United States Patent
Kirby et al.

(10) Patent No.: US 7,169,248 B1
(45) Date of Patent: Jan. 30, 2007

(54) METHODS FOR RELEASABLY ATTACHING SUPPORT MEMBERS TO MICROFEATURE WORKPIECES AND MICROFEATURE ASSEMBLIES FORMED USING SUCH METHODS

(75) Inventors: Kyle K. Kirby, Boise, ID (US); Steven D. Oliver, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/185,045

(22) Filed: Jul. 19, 2005

(51) Int. Cl.
*B29C 65/44* (2006.01)
*B32B 38/10* (2006.01)
*H01L 21/301* (2006.01)
*H01L 21/302* (2006.01)

(52) U.S. Cl. .................. 156/250; 156/230; 156/272.2; 156/275.7; 438/113; 438/118; 438/458; 438/460; 438/464

(58) Field of Classification Search ............. 156/230, 156/236; 438/455, 459, 460, 464, 458, 113, 438/118, 107
See application file for complete search history.

(56) References Cited

U.S. PATENT DOCUMENTS

| | | | | |
|---|---|---|---|---|
| 4,353,952 | A | * | 10/1982 | Brown et al. ............... 428/201 |
| 5,824,177 | A | * | 10/1998 | Yoshihara et al. .......... 156/250 |
| 5,888,883 | A | * | 3/1999 | Sasaki et al. ............... 438/460 |
| 6,204,079 | B1 | * | 3/2001 | Aspar et al. .................. 438/25 |
| 6,214,733 | B1 | * | 4/2001 | Sickmiller .................. 438/691 |
| 6,232,136 | B1 | * | 5/2001 | Zavracky et al. ............. 438/30 |
| 6,358,354 | B1 | * | 3/2002 | Patil ........................ 156/273.3 |
| 6,558,975 | B2 | * | 5/2003 | Sugino et al. ................ 438/64 |
| 6,642,126 | B2 | * | 11/2003 | Igel ............................ 438/460 |
| 6,896,760 | B1 | | 5/2005 | Connell et al. |
| 7,022,418 | B2 | | 4/2006 | Connell et al. |
| 7,037,751 | B2 | | 5/2006 | Connell et al. |

FOREIGN PATENT DOCUMENTS

EP 1041624 A1 * 10/2000

OTHER PUBLICATIONS

U.S. Appl. No. 11/385,356, filed Mar. 21, 2006, Connell et al.

(Continued)

*Primary Examiner*—Melvin Mayes
*Assistant Examiner*—Sonya Mazumdar
(74) *Attorney, Agent, or Firm*—Perkins Coie LLP

(57) ABSTRACT

Methods for releasably attaching support members to microfeature workpieces and microfeature assemblies formed using such methods. A method for processing a microfeature workpiece in accordance with one embodiment includes applying adhesive material to a non-active portion on a first side of a workpiece. The workpiece can include a first active portion and a second active portion separated from each other at least in part by the non-active portion. The method continues by adhesively attaching the first side of the workpiece to a first support member, and releasably attaching the second side of the workpiece to a second support member. The method further includes separating the first active portion from the second active portion while the workpiece is attached to the second support member by cutting through the first support member and the non-active portion of the workpiece. The separation process removes at least approximately all the adhesive material from the non-active portion of the workpiece.

38 Claims, 9 Drawing Sheets

OTHER PUBLICATIONS

U.S. Appl. No. 11/386,208, filed Mar. 22, 2006, Connell et al.
U.S. Appl. No. 11/374,750, filed Mar. 14, 2006, Pratt et al.
Sumitomo 3M Ltd., Product Description, H-WSS (Wafer Support System) For Ultra Thin Wafer Backgrinding, 2 pages, Sep. 1, 2003.

* cited by examiner

METHODS FOR RELEASABLY ATTACHING SUPPORT MEMBERS TO MICROFEATURE WORKPIECES AND MICROFEATURE ASSEMBLIES FORMED USING SUCH METHODS

TECHNICAL FIELD

The present invention is directed generally toward methods for releasably attaching support members to microfeature workpieces and microfeature assemblies formed using such methods.

BACKGROUND

Existing microelectronic device packages typically include a microelectronic die attached to a support member, such as a printed circuit board. Bond pads or other terminals on the die are electrically connected to corresponding terminals on the support member, for example, with solder balls or wires. The connection between the die and the support member can be protected by encapsulating the die to form a device package. The package can then be electrically connected to other microelectronic devices or circuits in many types of consumer or industrial electronic products.

Manufacturers are under continuous pressure to reduce the size of the electronic products they make. Accordingly, microelectronic die manufacturers seek to reduce the size of the packaged dies incorporated into the electronic products. One approach to reducing the size of the packaged dies is to reduce the thickness of the dies themselves, for example, by grinding the back side of the wafer from which the die is singulated or diced. One drawback with this approach, however, is that thin wafers are extremely fragile and therefore difficult to handle.

One approach addressing this drawback is to attach a relatively thick wafer support to the wafer during the grinding process to ensure survival of the wafer as well as to facilitate handling of the wafer during processing. One system, for example, includes attaching a wafer to a wafer support using an adhesive material. The wafer support is then removed after the wafer is processed, for example, by heating the bond between the wafer and the wafer support, or by dissolving the bond with an acid. The resulting thin wafer is ready for further processing and/or packaging.

One drawback with the foregoing approach is that the adhesive material used to secure the wafer to the wafer support can be difficult to remove from the wafer after processing. As discussed above, for example, removing the adhesive material may require heat and/or solvents. Accordingly, the wafer can be vulnerable to damage and/or breakage during removal of the adhesive material. A further drawback of the foregoing approach is that the adhesive material on the wafer may contact sensitive portions of the individual dies and damage and/or contaminate the dies. Accordingly, there is a need to improve the handling of microfeature workpieces during processing.

DETAILED DESCRIPTION

A. Overview/Summary

Figure 1A:
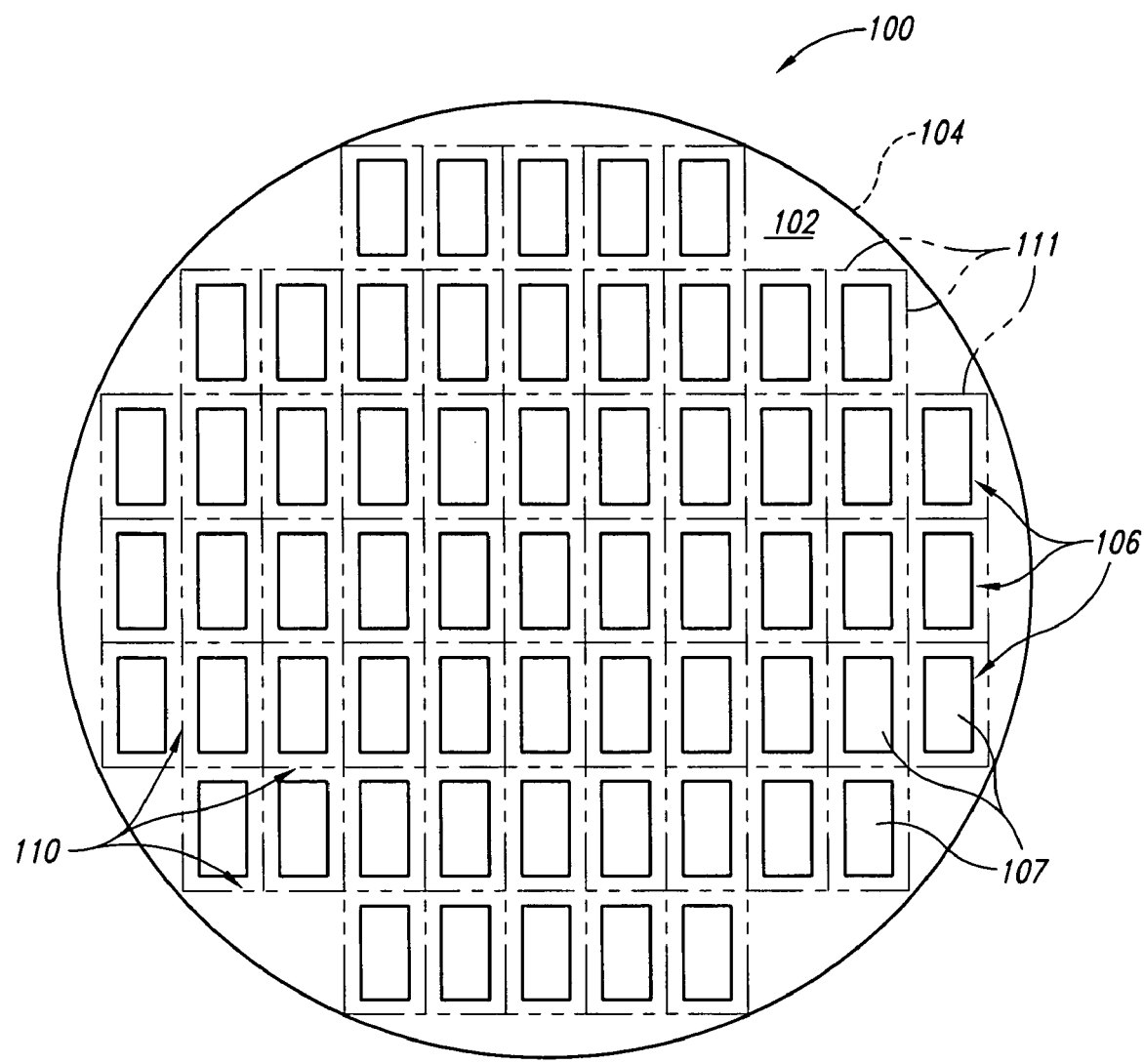
FIGS. 1A–1G illustrate various stages of a method for releasably attaching a microfeature workpiece to a support member in accordance with an embodiment of the invention.

The present invention is directed toward methods for releasably attaching support members to microfeature workpieces and microfeature assemblies formed using such methods. One particular embodiment of such a method comprises applying adhesive material to a non-active portion on a first side of a workpiece. The workpiece can include a first active portion and a second active portion separated from each other at least in part by the non-active portion. The method continues by adhesively attaching the first side of the workpiece to a first support member, and releasably attaching the second side of the workpiece to a second support member. The method further includes separating the first active portion from the second active portion while the workpiece is attached to the second support member by cutting through the first support member and the non-active portion of the workpiece. The separation process removes at least approximately all the adhesive material from the non-active portion of the workpiece. In several embodiments, the method can further include removing material from the second side of the workpiece to thin the workpiece after attaching the workpiece to the first support member and before attaching the workpiece to the second support member.

Another embodiment of a method for processing microfeature workpieces comprises applying adhesive material to non-active portions on a first side of a microfeature workpiece. The workpiece can include a plurality of microelectronic dies separated from each other at least in part by the non-active portions. The individual microelectronic dies each include an active portion. The method continues by adhesively attaching the first side of the microfeature workpiece to a first support member. The method can also include removing material from a second side of the workpiece to thin the workpiece from a first thickness to a second thickness less than the first thickness while the workpiece is attached to the first support member. The method further includes releasably attaching the second side of the workpiece to a second support member and, while the workpiece is attached to the second support member, separating each of the plurality of dies from each other. The dies can be singulated by cutting through the first support member and the non-active portions of the workpiece to remove at least approximately all the adhesive material from the non-active portions of the workpiece.

Additional embodiments of the invention are directed toward microfeature assemblies. One embodiment of such an assembly includes a microfeature workpiece having a first side, a second side opposite the first side, a first active portion, a second active portion, and a non-active portion separating the first active portion from the second active portion. The assembly also includes a sacrificial first support member positioned proximate to the first side of the workpiece. The assembly further includes adhesive material disposed between the workpiece and the first support member. In one aspect of this embodiment, the adhesive material is disposed on the non-active portion of the workpiece and is at least generally out of contact with the first and second active portions.

The term "microfeature workpiece" is used throughout to include substrates upon which and/or in which microelectronic circuits or components, data storage elements or layers, vias or conductive lines, micro-optic features, micromechanical features, and/or microbiological features are or can be fabricated using microlithographic techniques. The term "microfeature assembly" is used throughout to include a variety of articles of manufacture, including, e.g., semiconductor wafers having active components, individual integrated circuit dies, packaged dies, and subassemblies comprising two or more microelectronic workpieces or components, e.g., a stacked die package. Many specific details of certain embodiments of the invention are set forth in the following description and in FIGS. 1A–3B to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the invention. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of features are not precluded.

B. Embodiments of Methods for Releasably Attaching Support Members to Microfeature Workpieces FIGS. 1A–1G illustrate various stages of a method for releasably attaching a microfeature workpiece to a support member. More specifically, FIGS. 1A–1G illustrate stages of a method for releasably attaching a front side of the workpiece to a support member using an adhesive disposed only on non-active portions of the workpiece so that after processing the support member can be removed from the workpiece without contaminating and/or damaging the active portions of the workpiece.

FIG. 1A is a top plan view of a microfeature workpiece 100 at an initial stage before the workpiece has been attached to a support member. The workpiece 100 includes a front side 102 and a back side 104 facing opposite the front side 102. The workpiece 100 further includes a plurality of microelectronic components 106 (e.g., microelectronic dies) having active portions 107 (shown schematically in the Figures) positioned at least proximate to the front side 102 of the workpiece 100. The active portions 107 can include circuit elements or devices, such as lines, vias, terminals, transistors, data storage elements, image sensors, or other conductor or semiconductor components arranged in an array on the workpiece 100. The individual active portions 107 on the workpiece 100 can be separated from each other by a plurality of non-active portions 110. These non-active portions 110 are commonly aligned with one another to facilitate cutting with a wafer saw, defining so-called streets or scribe lines 111 between the individual components 106. In other embodiments, the active portions 107 and/or non-active portions 110 can include other features and/or have other arrangements. For example, in several embodiments the non-active portions 110 may contain sacrificial active elements (e.g., test or diagnostic elements) that are active during processing of the workpiece 100, but not active when processing of the workpiece is completed.

Figure 1B:
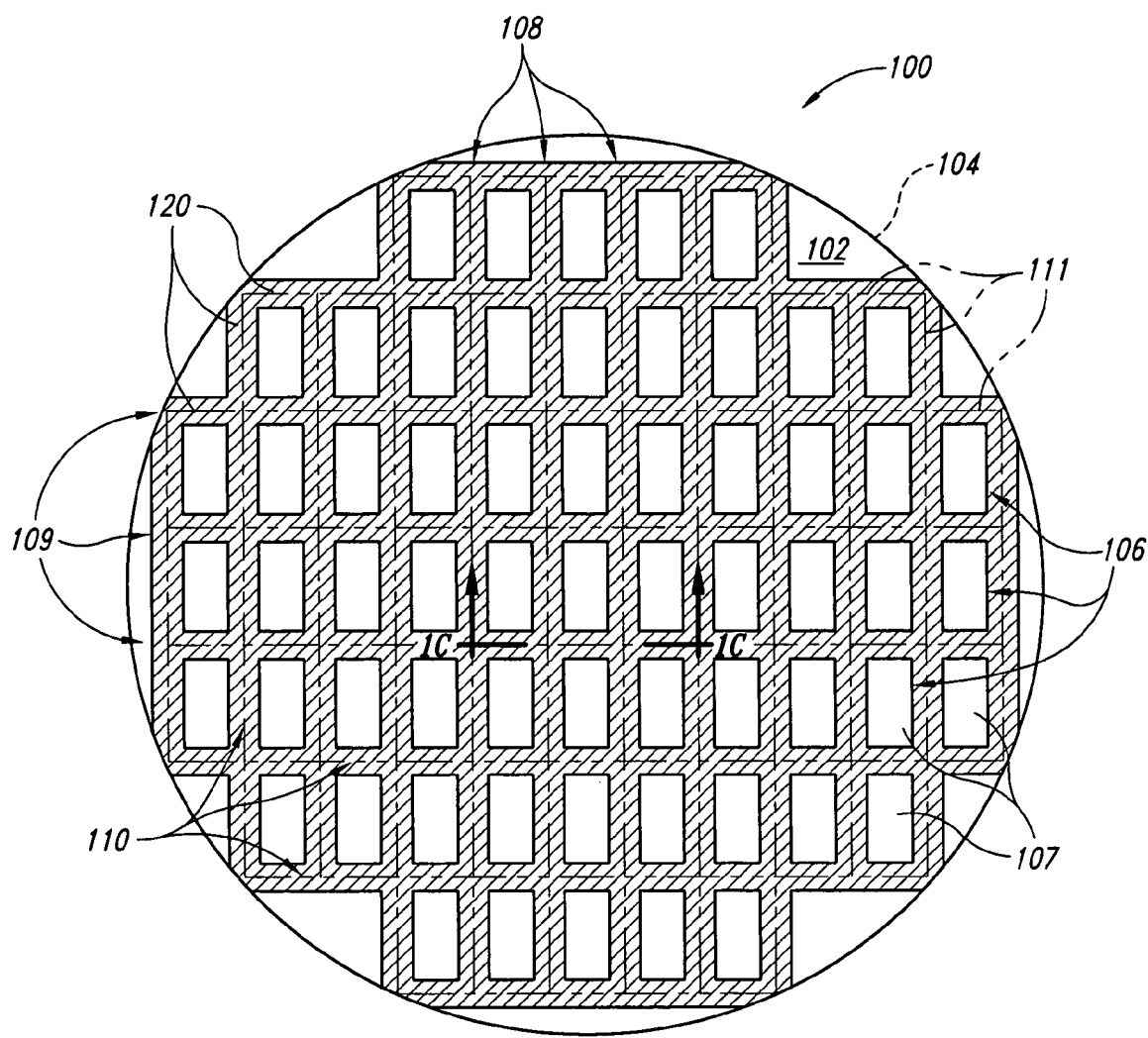

Referring next to FIG. 1B, an adhesive material 120 is deposited onto one or more of the non-active portions 110 on the front side 102 of the workpiece 100. In one aspect of this embodiment, the adhesive material 120 can be a bead of adhesive material deposited onto the non-active portions 110 in a plurality of generally parallel columns 108 and rows 109 (corresponding at least in part to the scribe lines 111) that are approximately as wide as a wafer saw or dicing blade that is subsequently used to singulate the workpiece 100, as discussed in greater detail below with respect to FIG. 1F.

The adhesive material 120 can include an epoxy material or other suitable material. As discussed below, the adhesive material 120 does not need to have any special release characteristics because all or substantially all the adhesive material 120 is removed during the singulation process. The adhesive material 120 can be deposited onto the front side 102 of the workpiece using a pen-type dispensing process, a screen printing process, a photoetch process, precut strips or grids of adhesive material deposited onto desired portions of the workpiece 100, a tape dispensing process (e.g., a layer of tape over all or substantially all the front side 102 of the workpiece 100 with cut-out portions corresponding to one or more of the active portions 107), or another suitable process known to those of ordinary skill in the art.

Figure 1C:
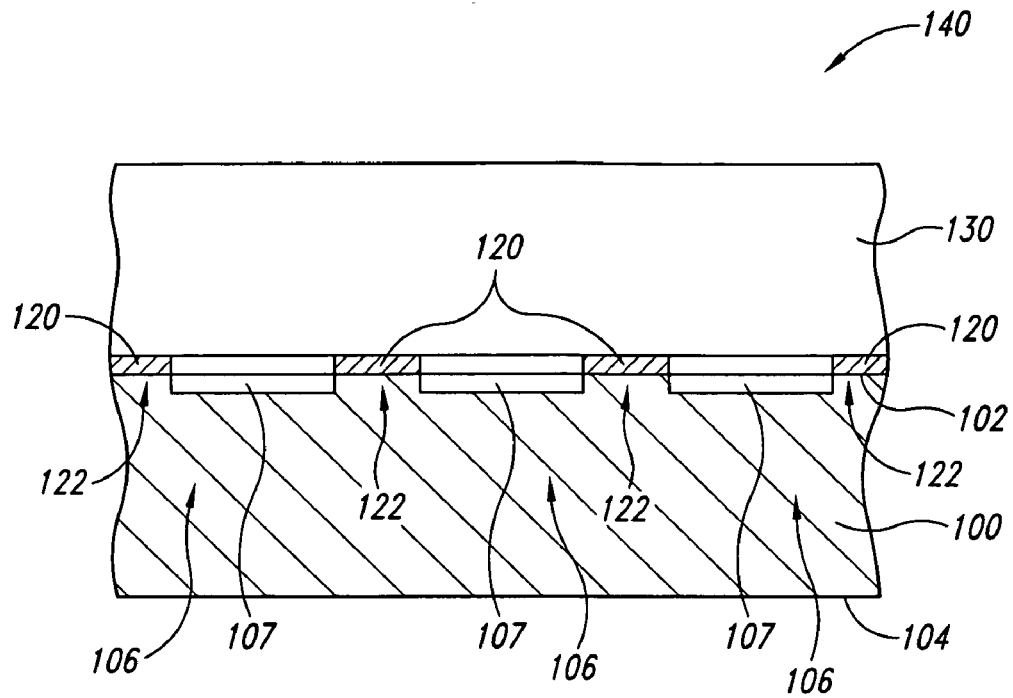

FIG. 1C is a side cross-sectional view of the workpiece 100 taken along line 1C—1C of FIG. 1B after a sacrificial first support member 130 (e.g., a carrier substrate) is attached at one or more attachment locations 122 on the front side 102 of the workpiece 100 to form a microfeature assembly 140. Each attachment location 122 can include a portion of adhesive material 120 to secure the first support member 130 to the workpiece 100. The first support member 130 can be glass, quartz, or another material that is at least partially transparent. In several embodiments, for example, the active portions 107 can include image sensors and the first support member 130 can be at least partially transmissive to ultraviolet radiation so that the first support member 130 does not obstruct the image sensors during testing (e.g., illumination of the image sensors). In other embodiments, the first support member 130 can include other suitable materials, including opaque materials.

The first support member 130 can be sized and shaped to receive the workpiece 100 and provide support to the workpiece 100 during subsequent processing steps. In one embodiment, the first support member 130 can be generally rigid and has a planform shape at least approximately identical to that of the workpiece 100. In alternative embodiments, however, the first support member 130 can be slightly larger than the workpiece 100 to avoid the need for precisely aligning the workpiece 100 with the first support member 130 when attaching the two together and for protecting the edge after thinning.

Figure 1D:
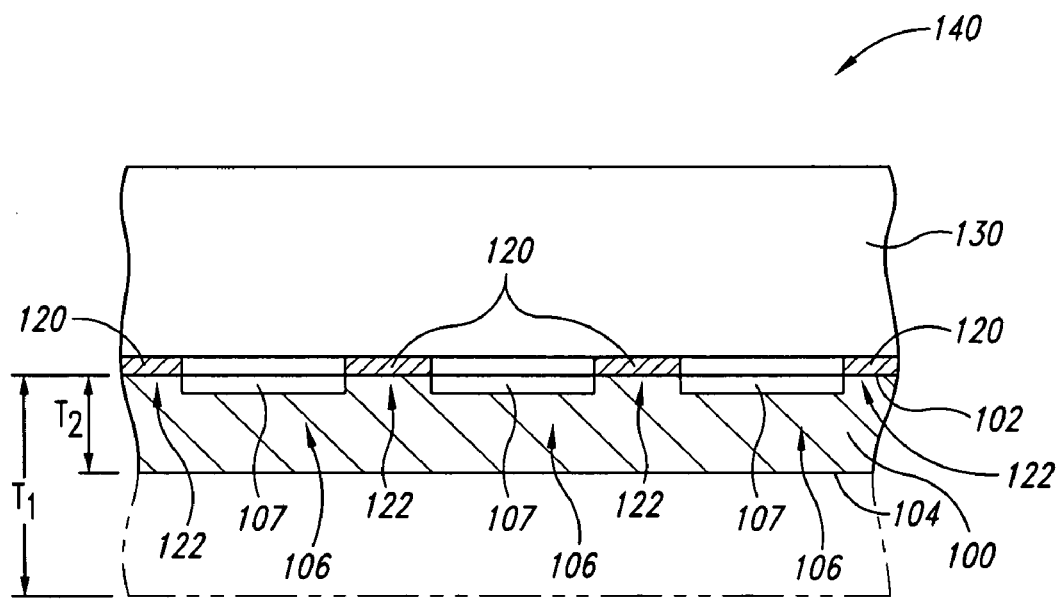

After the first support member 130 has been attached to the workpiece 100, the workpiece is ready for additional processing. In one embodiment, the additional processing can include removing material from the back side 104 of the workpiece 100 to reduce its thickness. FIG. 1D, for example, is a side cross-sectional view of the assembly 140 after the workpiece 100 has been thinned. More specifically, the workpiece 100 has been thinned from a first thickness $T_1$ (shown in broken lines) to a second thickness $T_2$ less than the first thickness $T_1$. In one embodiment, the material can be removed from the back side 104 by grinding and/or etching. In other embodiments, the material can be removed from the back side 104 in accordance with other existing processes. In any of these embodiments, the first support member 130 can provide sufficient support to the workpiece 100 to prevent it from breaking and/or excessively warping during processing. In one aspect of these embodiments, the thickness of the assembly 140 after it has been thinned may be slightly greater than that of a conventional microfeature workpiece, but the overall size and shape of the assembly 140 can be generally the same as the size and shape of conventional microfeature workpieces. Accordingly, the equipment and steps used to process the workpiece 100 with the first support member 130 attached can be similar or identical to the equipment and steps used to process existing microfeature workpieces.

Figure 1E:
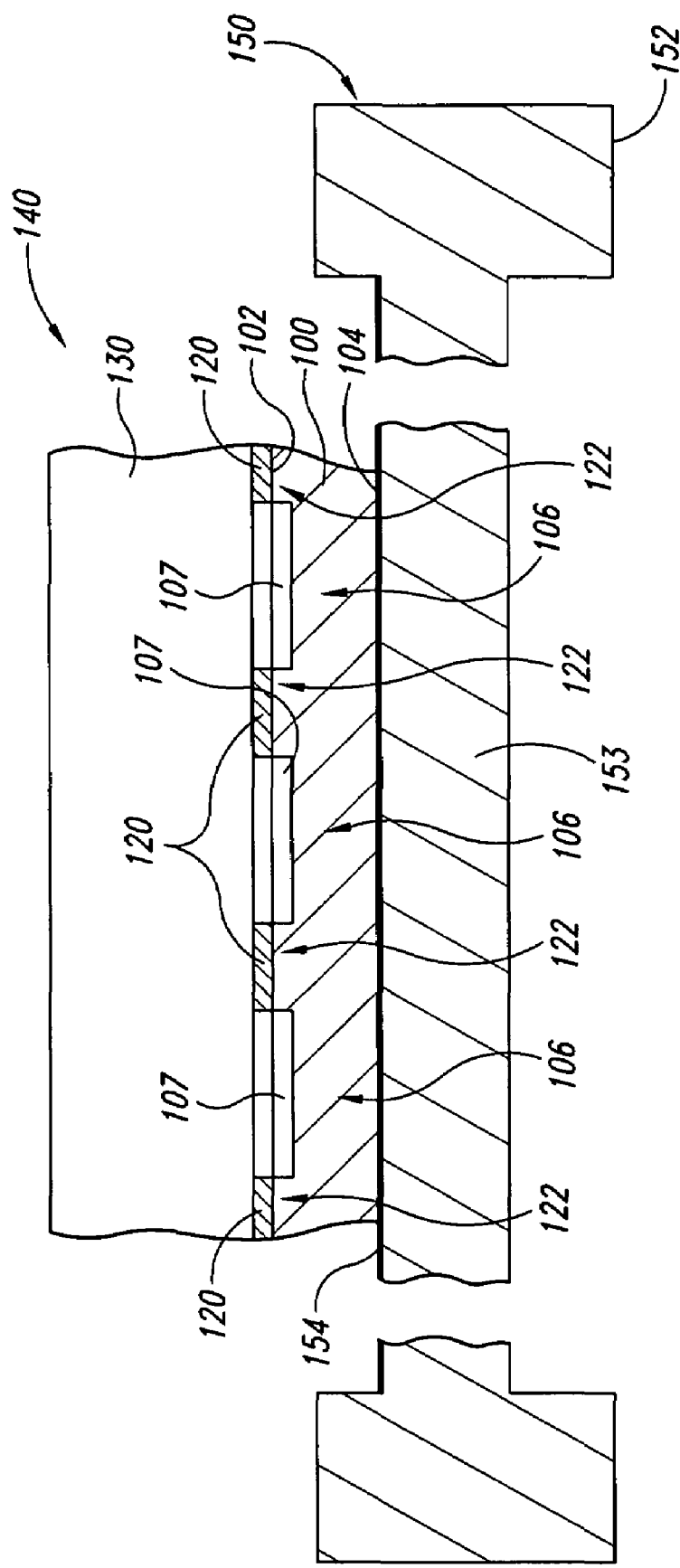

Referring next to FIG. 1E, the assembly 140 can be inverted and attached as a unit to a second support member 150. In one aspect of this embodiment, the second support member 150 can include an existing dicing support having a frame 152 carrying a replaceable film 153 that can include an attachment device 154 (e.g., tape) that releasably adheres to the back side 104 of the workpiece 100. Accordingly, the second support member 150 can support the back side 104 of the workpiece 100, while the first support member 130 continues to provide support for the front side 102 of the workpiece 100.

Figure 1F:
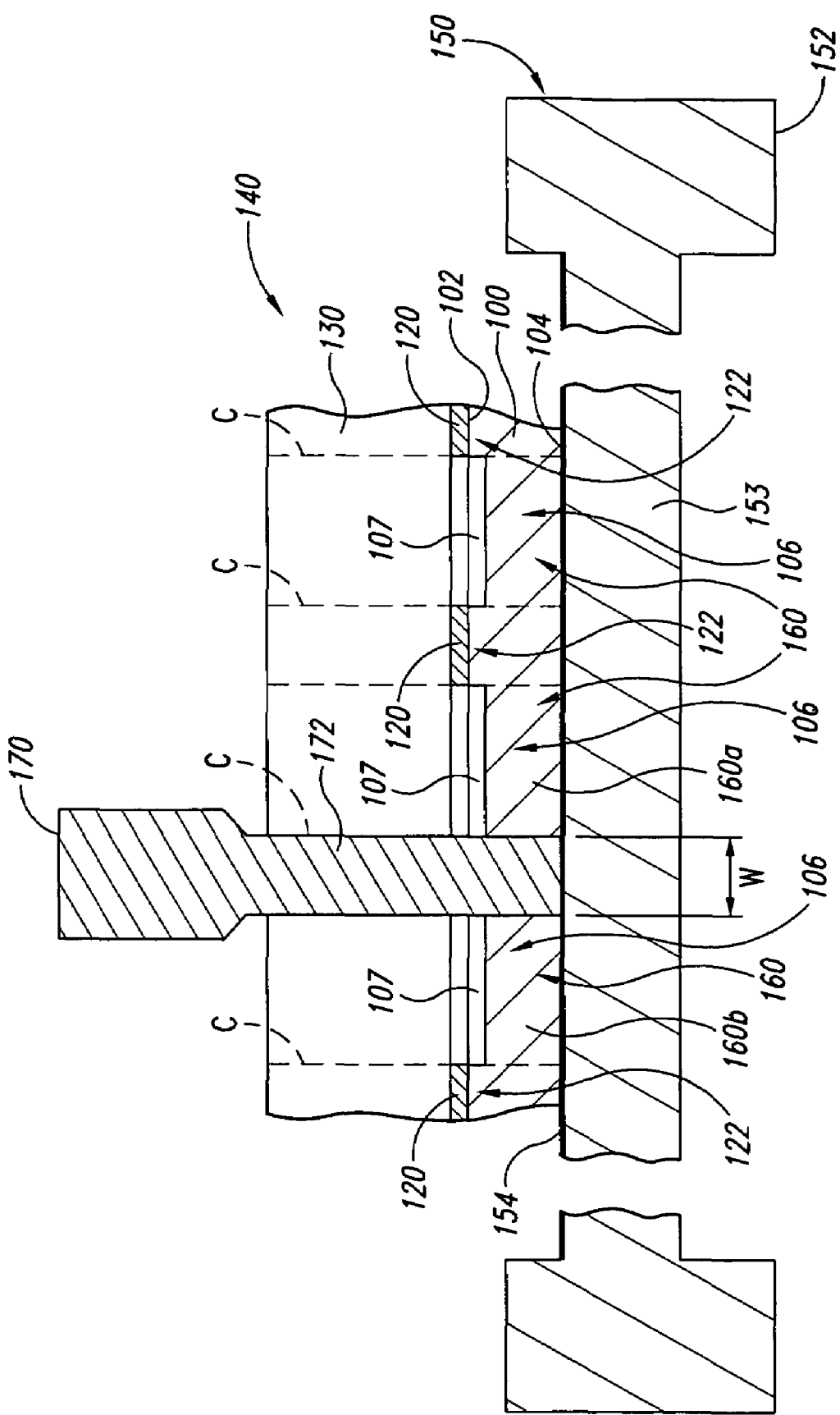

Referring next to FIG. 1F, the assembly 140 can be diced, singulated, or otherwise separated to produce a plurality of microelectronic dies 160, including a first die 160a and a second die 160b, separated by incisions C. In one embodiment, for example, a wafer saw 170 can be used to form the incisions C. The saw 170 can cut through the first support member 130, the adhesive material 120, the workpiece 100, and in some cases at least a portion of the attachment device 154. The motion of the first support member 130 can be controlled during singulation to avoid damage to the dies 160. In one aspect of this embodiment, the wafer saw 170 includes a blade 172 having a width W corresponding at least in part to the width of the non-active portions 110 (FIG. 1B) on the workpiece 100. For example, the width W of the blade 172 is at least as wide as the width of the adhesive material 120 deposited onto the non-active portion 110 between the first die 160a and the second die 160b so that all or substantially all the adhesive material 120 is removed from the assembly 140 during the singulation process. In other embodiments, the width W of the blade 172 may be narrower than the width of the adhesive material 120 between the first die 160a and the second die 160b, and a suitable post-processing cleaning step can be used to remove the remaining adhesive material 120 from the dies 160.

Figure 1G:
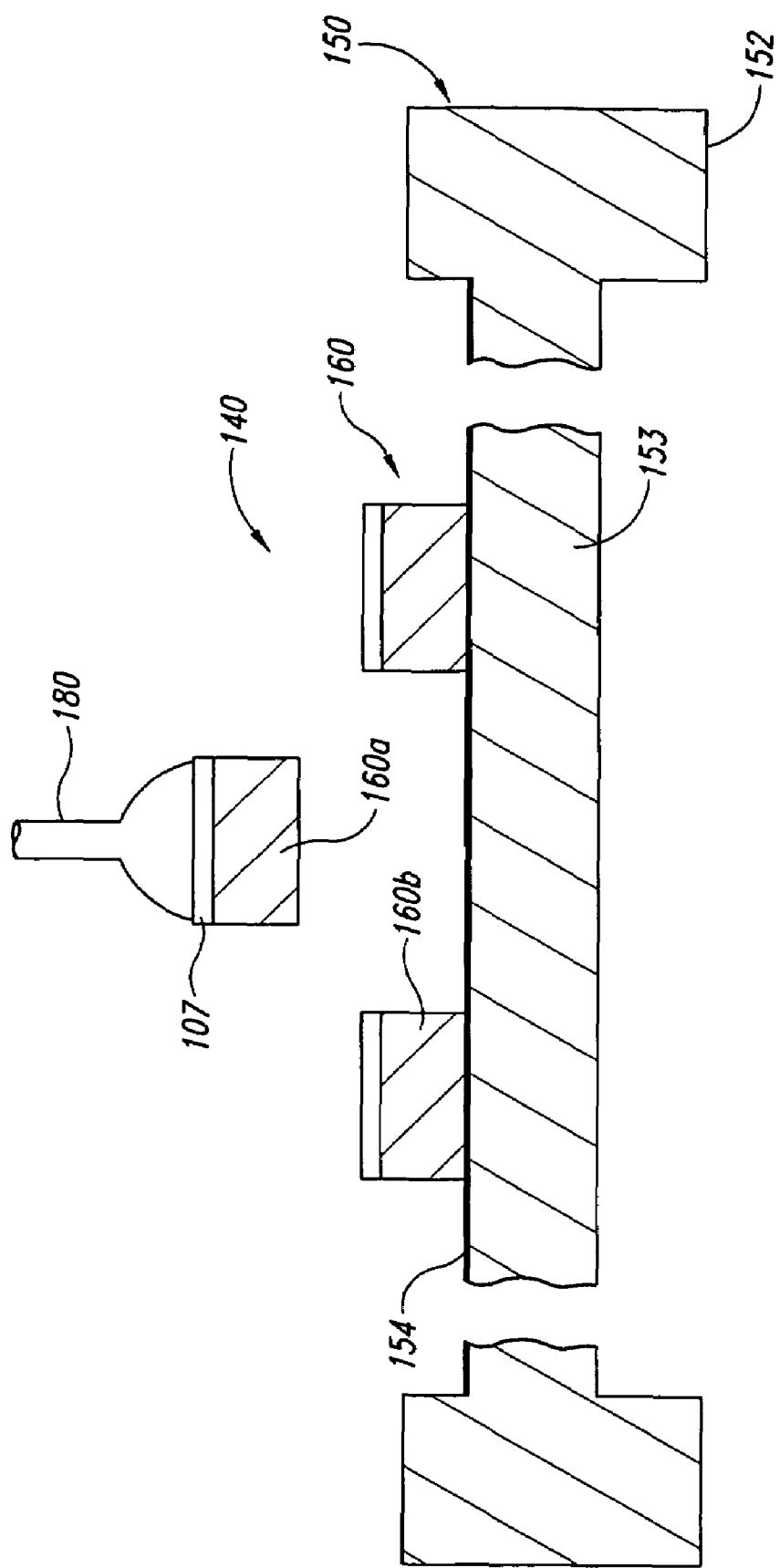

Referring now to FIG. 1G, a conventional pick-and-place apparatus 180 can be used to remove the first die 160a from the remainder of the assembly 140. In one embodiment, the attachment device 154 remains attached to the film 153 so that no portion of the attachment device 154 is removed with the first die 160a. In another embodiment, at least a portion of the attachment device 154 can be removed along with the first die 160a, and can later be removed from the first die 160a in a separate step. In either embodiment, the first die 160a can be removed from the second support member 150 while the second die 160b remains proximate to the second support member 150. The foregoing removal process can then be repeated from the second die 160b and other dies 160. In several embodiments, a release agent (e.g., ultraviolet radiation) may be used to facilitate removal of the dies 160 from the attachment device 154. After removal, the dies 160 can undergo further packaging and/or processing steps.

One feature of embodiments of the method described above with respect to FIGS. 1A–1G is that the adhesive material 120 is applied to non-active portions 110 of the workpiece 100. Accordingly, all or at least approximately all the adhesive material 120 is removed from the workpiece 100 during singulation. An advantage of this feature is that the adhesive material 120 does not need to have any special release characteristics or require any post-processing cleaning to remove adhesive material residue from the singulated dies. Accordingly, the various components of the dies 160 are less likely to be contaminated and/or damaged as compared to conventional processes that require heat, solvents, and/or post-processing cleaning to remove the adhesive material 120 from the workpiece 100.

Another feature of embodiments of the method described above with reference to FIGS. 1A–1G is that the first support member 130 can remain attached to the workpiece 100 as the workpiece is thinned and attached to the second support member 150. An advantage of this feature is that the workpiece 100 can be less likely to be damaged or broken as it is transferred from a grinder or other thickness-reducing tool to the second support member 150. The first support member 130 can also provide a generally rigid support structure that reduces the likelihood for the workpiece 100 to bend or warp during additional processing.

Still another feature of embodiments of the method described above is that the first support member 130 is releasably attached to the front side 102 of the workpiece 100 over all or substantially all the active portions 107 of the workpiece 100. An advantage of this feature is that the active portions 107 of the workpiece 100 are less likely to be damaged as the workpiece 100 is processed because the first support member 130 provides support and protection. For example, the first support member 130 can shield the active portions 107 from incidental contact with surrounding tools, machinery, and/or other components.

Figure 2:
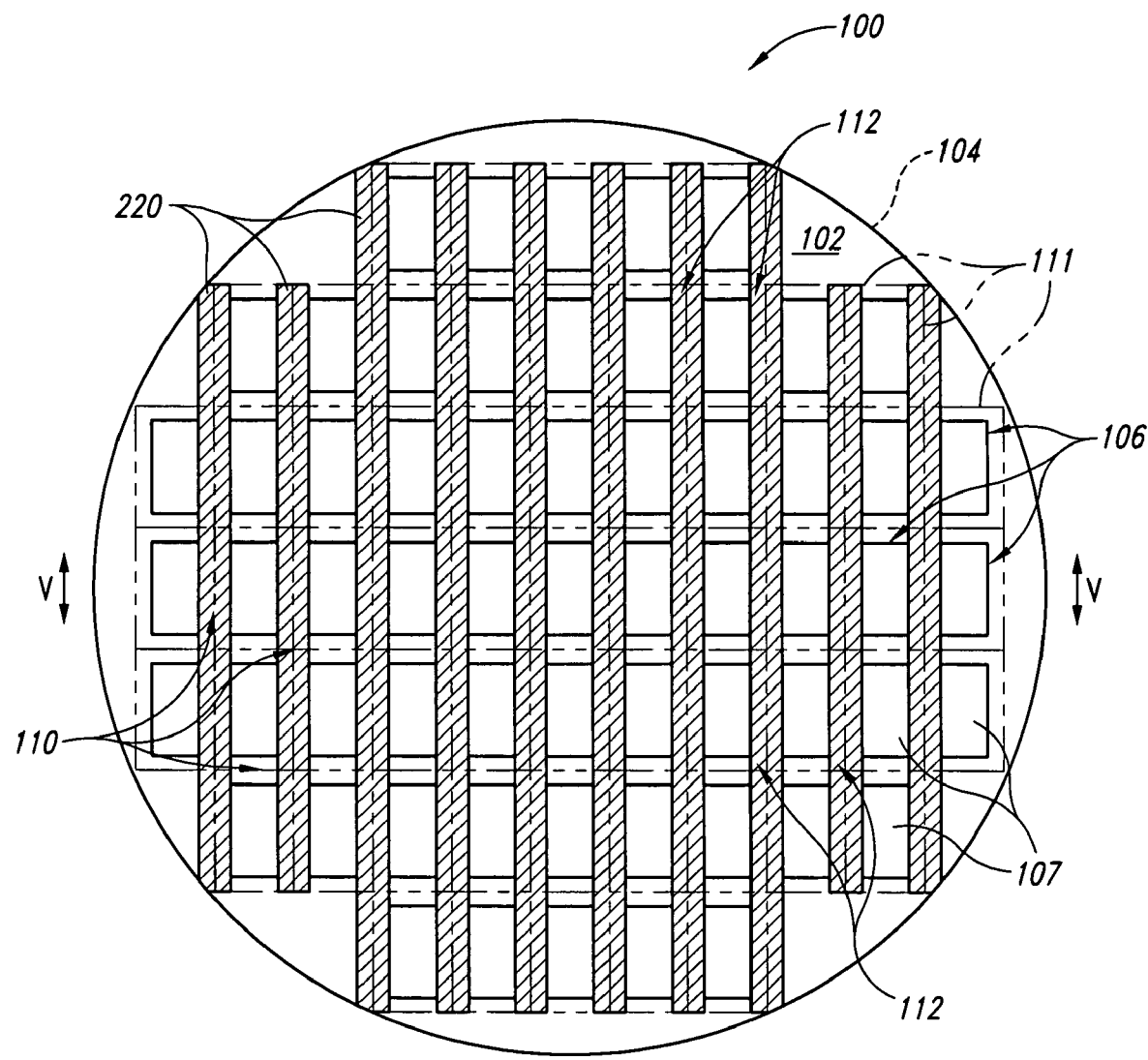
FIG. 2 illustrates a stage in a method for releasably attaching a microfeature workpiece to a support member in accordance with another embodiment of the invention.

C. Additional Embodiments of Methods for Releasably Attaching Support Members to Microfeature Workpieces FIG. 2 illustrates a stage in a method of releasably attaching a support member to a microfeature workpiece in accordance with another embodiment of the invention. More specifically, FIG. 2 is a top plan view of the workpiece 100 after an adhesive material 220 has been deposited onto the workpiece 100. This stage of this method differs from the stages described above in that the adhesive material 220 deposited on the front side 102 of the workpiece 100 is applied in only one direction (as shown by arrows V), as opposed to the bi-directional application of the adhesive material 120 described above with respect to FIG. 1B. One advantage of applying the adhesive material 220 in only one direction is that the adhesive material 220 is less likely to build up at intersections 112 of the scribe lines 111 on the workpiece 100. Excessive build-up of the adhesive material can result in additional residue on the workpiece after singulation that can contaminate the active portions 107 and/or require additional post-processing removal. In alternative embodiments, the adhesive material 220 may be deposited onto the workpiece 100 in other directions, patterns, and/or arrangements. After applying the adhesive material 220, the workpiece 100 can undergo additional processing steps that are at least generally similar to those described above with reference to FIGS. 1C–1G.

Figure 3A:
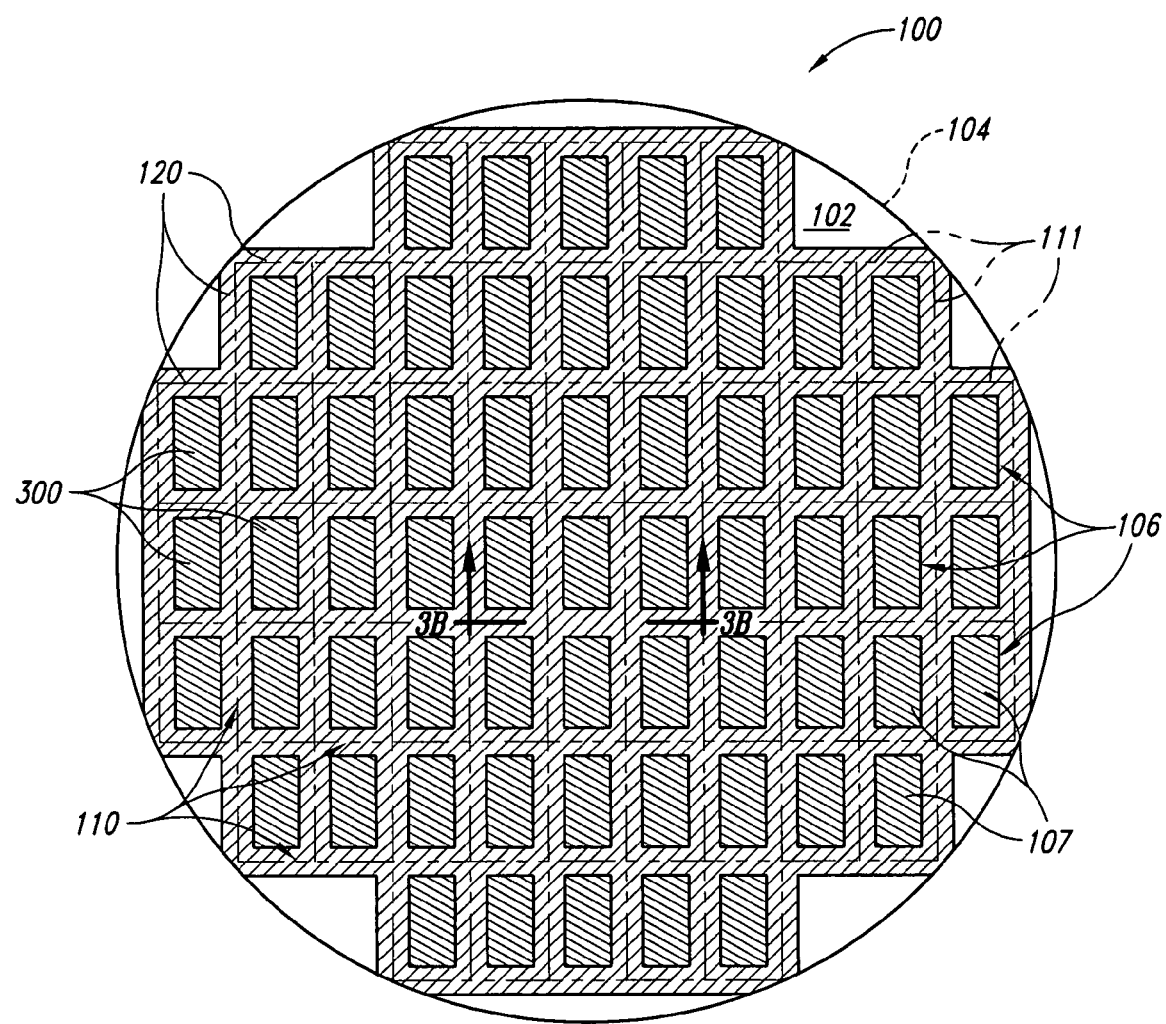
FIGS. 3A and 3B illustrate stages in a method for releasably attaching a microfeature workpiece to a support member in accordance with still another embodiment of the invention.
Figure 3B:
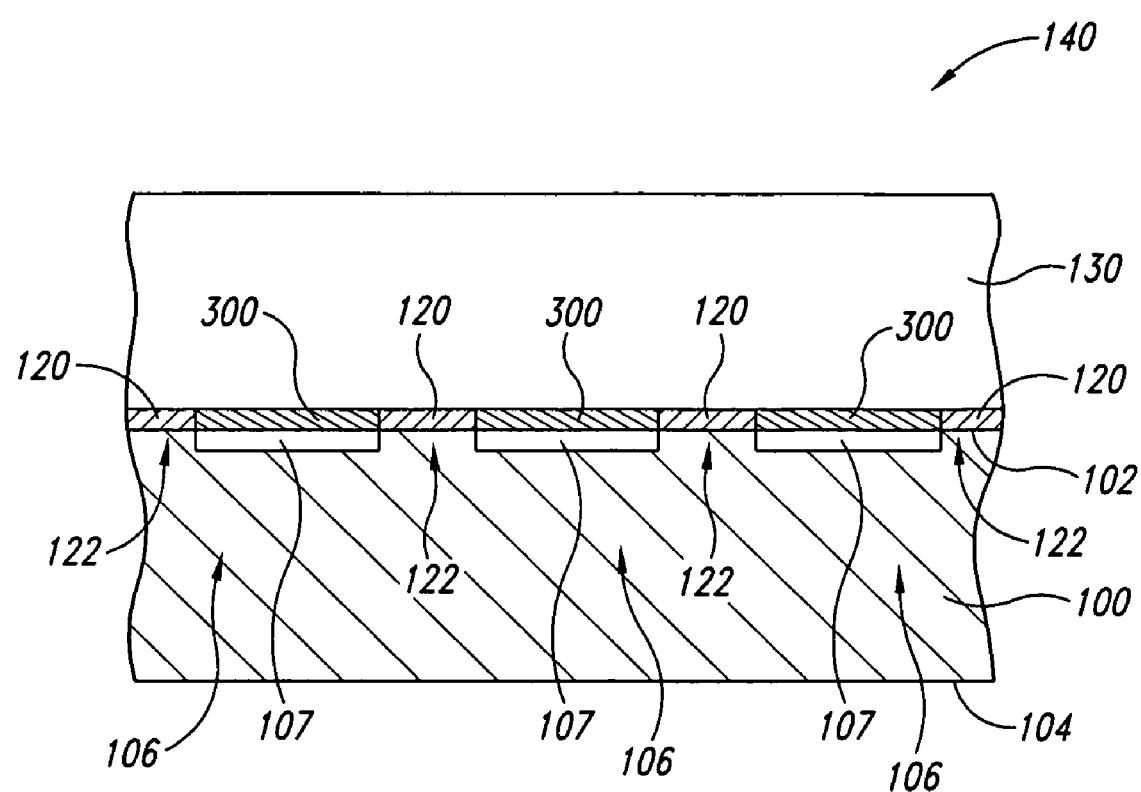

FIGS. 3A and 3B illustrate stages in a method of releasably attaching a support member to a microfeature workpiece in accordance with still another embodiment of the invention. More particularly, FIG. 3A is a top plan view of the workpiece 100 after a removable cover material 300 has been deposited onto the front side 102 of the workpiece 100 and selectively removed using a masking process or other suitable process, leaving the remaining portions of the cover material 300 only on the active portions 107. The removable cover material 300 can include a photoresist or other selectively removable substance. As discussed below, the remaining cover material portions 300 can protect the active portions 107 of the workpiece 100 during subsequent processing steps.

FIG. 3B is a side cross-sectional view of the workpiece 100 taken along line 3B–3B of FIG. 3A after the first support member 130 is attached to the workpiece 100 to form the microfeature assembly 140. In one aspect of this embodiment, the cover material portions 300 fill the gaps between the first support member 130 and the active portions 106 of the workpiece 100. One advantage of this arrangement is that the cover material 300 can protect the active portions 107 during singulation or subsequent processing procedures. For example, the cover material 300 can protect the active portions 107 from fluids and particulates while dicing the first support member 130 and the workpiece 100, as described above with respect to FIG. 1F. The cover material 300 can be removed from the workpiece 100 either during or after the various processing steps described above.

From the foregoing, it will be appreciated that specific embodiments of the invention have been described herein for purposes of illustration, but that various modifications may be made without deviating from the invention. For example, anodic bonding or fusion bonding may be used in lieu of or in addition to the adhesive material deposited onto the workpiece. Aspects of the invention described in the context of particular embodiments may be combined or eliminated in other embodiments. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

We claim:

1. A method for processing a microfeature workpiece, the method comprising:
  applying adhesive material to a non-active portion on a first side of a workpiece, the workpiece having a first active portion and a second active portion separated from each other at least in part by the non-active portion, wherein applying adhesive material to a non-active portion includes keeping the adhesive material at least generally out of contact with the first active portion and the second active portion;
  adhesively attaching the first side of the workpiece to a first support member;
  releasably attaching the second side of the workpiece to a second support member; and
  separating the first active portion from the second active portion while the workpiece is attached to the second support member by cutting through the first support member and the non-active portion of the workpiece to remove at least approximately all the adhesive material from the non-active portion of the workpiece.

2. The method of claim 1, further comprising removing material from a second side of the workpiece to thin the workpiece after attaching the first side of the workpiece to the first support member and before releasably attaching the second side of the workpiece to the second support member.

3. The method of claim 1 wherein the workpiece includes a first die having the first active portion and a second die having the second active portion, and wherein the method further includes removing the first die and the second die from the second support member.

4. The method of claim 1 wherein the first support member includes a first portion over the first active portion and a second portion over the second active portion, and wherein separating the first active portion from the second active portion includes separating the first active portion from the first portion of the first support member and separating the second active portion from the second portion of the first support member.

5. The method of claim 1 wherein applying adhesive material to a non-active portion of the workpiece includes depositing the adhesive material onto at least a portion of a scribe line between the first active portion and the second active portion.

6. The method of claim 1 wherein applying adhesive material to a non-active portion of the workpiece includes dispensing the adhesive material using a pen-type dispensing process.

7. The method of claim 1 wherein applying adhesive material to a non-active portion of the workpiece includes dispensing the adhesive material using a photoetch process.

8. The method of claim 1 wherein applying adhesive material to a non-active portion of the workpiece includes applying precut strips or grids of adhesive material to the non-active portion of the workpiece.

9. The method of claim 1 wherein applying adhesive material to a non-active portion of the workpiece includes screen printing the adhesive material to the non-active portion of the workpiece.

10. The method of claim 1 wherein applying adhesive material to a non-active portion of the workpiece includes dispensing the adhesive material using a tape dispensing process.

11. The method of claim 1 wherein applying adhesive material to a non-active portion of the workpiece includes dispensing a bead of epoxy on the non-active portion of the workpiece.

12. The method of claim 1 wherein adhesively attaching the workpiece to a first support member includes adhesively attaching the workpiece to a glass support member, a quartz support member, or a support member that is at least partially transmissive to ultraviolet radiation.

13. The method of claim 1 wherein adhesively attaching the workpiece to a first support member includes adhesively attaching the workpiece to a generally rigid support member.

14. The method of claim 1 wherein:
  applying adhesive material to a non-active portion of the workpiece includes depositing a volume of adhesive material onto the non-active portion; and
  separating the first active portion from the second active portion includes cutting through the non-active portion and the volume of adhesive material with a wafer saw or dicing blade having a width that is at least approximately the same as a width of the volume of adhesive material deposited onto the non-active portion.

15. The method of claim 1, further comprising depositing a cover material onto the first active portion and the second active portion before adhesively attaching the first support member to the workpiece.

16. A method for processing a microfeature workpiece, the method comprising:
  applying adhesive material to a non-active portion on a first side of a workpiece, the workpiece having a first microelectronic die and a second microelectronic die separated from each other at least in part by the non-active portion, the first die having a first active portion and the second die having a second active portion, wherein applying adhesive material to a non-active portion of the workpiece includes keeping the adhesive material at least generally out of contact with the first active portion and the second active portion;

adhesively attaching the first side of the workpiece to a first support member;

removing material from a second side of the workpiece to thin the workpiece while the workpiece is attached to the first support member;

releasably attaching the second side of the workpiece to a second support member; and separating the first die from the second die by cutting through the first support member and the non-active portion of the workpiece to remove at least approximately all the adhesive material from the non-active portions of the workpiece while both the first die and the second die are attached to the second support member.

17. The method of claim 16 wherein the first support member includes a first portion attached to the first die and a second portion attached to the second die, and wherein separating the first die from the second die includes separating the first die from the first portion of the first support member and separating the second die from the second portion of the first support member.

18. The method of claim 16 wherein applying adhesive material to a non-active portion of the workpiece includes applying the adhesive material to at least a portion of a scribe line between the first die and the second die.

19. The method of claim 16 wherein applying adhesive material to a non-active portion of the workpiece includes dispensing the adhesive material using a pen-type dispensing process.

20. The method of claim 16 wherein applying adhesive material to a non-active portion of the workpiece includes dispensing the adhesive material using a photoetch process.

21. The method of claim 16 wherein applying adhesive material to a non-active portion of the workpiece includes applying precut strips or grids of adhesive material to the non-active portion of the workpiece.

22. The method of claim 16 wherein applying adhesive material to a non-active portion of the workpiece includes screen printing the adhesive material to the non-active portion of the workpiece.

23. The method of claim 16 wherein applying adhesive material to a non-active portion of the workpiece includes dispensing the adhesive material using a tape dispensing process.

24. The method of claim 16 wherein applying adhesive material to a non-active portion of the workpiece includes dispensing a bead of epoxy on the non-active portion of the workpiece.

25. The method of claim 16 wherein adhesively attaching the workpiece to a first support member includes adhesively attaching the workpiece to a glass support member, a quartz support member, or a support member that is at least partially transmissive to ultraviolet radiation.

26. The method of claim 16 wherein adhesively attaching the workpiece to a first support member includes adhesively attaching the workpiece to a generally rigid support member.

27. The method of claim 16 wherein applying adhesive material to a non-active portion of the workpiece includes depositing a volume of adhesive material onto the non-active portion having a width that is at least approximately the same as a width of a wafer saw or dicing blade that separates the first active portion from the second active portion.

28. A method for processing a microfeature workpiece, the method comprising:

depositing adhesive material on non-active portions on a first side of a microfeature workpiece, the workpiece having a plurality of microelectronic dies separated from each other at least in part by the non-active portions, the individual microelectronic dies each including an active portion, wherein depositing adhesive material on non-active portions of the workpiece includes keeping the adhesive material at least generally out of contact with the active portions of the workpiece;

supporting the first side of the microfeature workpiece with a sacrificial first support member;

removing material from a second side of the workpiece to thin the workpiece from a first thickness to a second thickness less than the first thickness while the workpiece is supported by the first support member;

temporarily supporting the workpiece and the first support member with a second support member positioned proximate the second side of the workpiece; and separating each of the plurality of dies from each other and corresponding portions of the first support member while the workpiece is temporarily supported by the second support member by cutting through the first support member and the non-active portions of the workpiece to remove at least approximately all of the adhesive material from the non-active portions of the workpiece.

29. The method of claim 28 wherein depositing adhesive material on non-active portions of the workpiece includes applying adhesive material in a plurality of generally parallel rows aligned with corresponding non-active portions on the workpiece.

30. The method of claim 28 wherein depositing adhesive material on non-active portions of the workpiece includes dispensing the adhesive material using a pen-type dispensing process.

31. The method of claim 28 wherein depositing adhesive material on non-active portions of the workpiece includes dispensing the adhesive material using a photoetch process.

32. The method of claim 28 wherein depositing adhesive material on non-active portions of the workpiece includes applying precut strips or grids of adhesive material to the non-active portions on the workpiece.

33. The method of claim 28 wherein depositing adhesive material on non-active portions of the workpiece includes screen printing the adhesive material to the non-active portions of the workpiece.

34. The method of claim 28 wherein depositing adhesive material on non-active portions of the workpiece includes dispensing the adhesive material using a tape dispensing process.

35. The method of claim 28 wherein depositing adhesive material on non-active portions of the workpiece includes dispensing a bead of epoxy on the non-active portions of the workpiece.

36. The method of claim 28 wherein supporting the first side of the microfeature workpiece with a sacrificial first support member includes supporting the workpiece with a glass support member, a quartz support member, or a support member that is at least partially transmissive to ultraviolet radiation.

37. A method for processing a microfeature workpiece having a front side, a back side opposite the front side, a first microelectronic die having a first active portion proximate the front side, and a second microelectronic die having a second active portion proximate the front side, the method comprising:
- attaching the front side of the workpiece to a first support member at one or more attachment locations, the attachment locations being spaced apart from the first active portion and the second active portion and including a volume of adhesive material generally out of contact with the first and second active portions;
- releasably attaching the back side of the workpiece to a second support member; and
- while the workpiece is attached to the second support member, dicing the workpiece at each of the attachment locations to (a) separate the first support member from the workpiece, and (b) separate the first active portion from the second active portion.

38. The method of claim 37 wherein the:
- attaching the front side of the workpiece to a first support member at one or more attachment locations includes adhesively attaching the first support member to the workpiece; and
- dicing the workpiece at each of the attachment locations includes cutting through the first support member and the attachment locations of the workpiece to remove at least approximately all the adhesive material from the workpiece.

* * * * *